(12) United States Patent
Geise

(10) Patent No.: US 8,833,726 B2
(45) Date of Patent: Sep. 16, 2014

(54) SEALING FRAME AND METHOD FOR COVERING A COMPONENT

(75) Inventor: Stephan Geise, Ruethen (DE)

(73) Assignee: Robert Bosch GmbH, Stuttgart (DE)

( * ) Notice: Subject to any disclaimer, the term of this patent is extended or adjusted under 35 U.S.C. 154(b) by 350 days.

(21) Appl. No.: 12/737,524

(22) PCT Filed: Jul. 6, 2009

(86) PCT No.: PCT/EP2009/058490
§ 371 (c)(1),
(2), (4) Date: Apr. 4, 2011

(87) PCT Pub. No.: WO2010/009970
PCT Pub. Date: Jan. 28, 2010

(65) Prior Publication Data
US 2011/0169191 A1    Jul. 14, 2011

(30) Foreign Application Priority Data

Jul. 24, 2008  (DE) .......................... 10 2008 040 676

(51) Int. Cl.
*H05K 5/00* (2006.01)
*H05K 3/28* (2006.01)
*H05K 5/06* (2006.01)

(52) U.S. Cl.
CPC ................ *H05K 3/284* (2013.01); *H05K 5/065* (2013.01); *H05K 2203/1469* (2013.01); *H05K 2203/1316* (2013.01)
USPC ....................................................... 249/139

(58) Field of Classification Search
CPC ............................. H05K 2203/1316
USPC ....................................................... 249/139
See application file for complete search history.

(56) References Cited

U.S. PATENT DOCUMENTS

| 3,120,573 A | * | 2/1964 | Gingrande et al. ........... 264/277 |
| 5,795,799 A | | 8/1998 | Hosoya |
| 6,131,467 A | | 10/2000 | Miyano et al. |

FOREIGN PATENT DOCUMENTS

| CN | 1375975 | 10/2002 |
| CN | 1381081 | 11/2002 |
| DE | 44 05 710 | 8/1995 |
| DE | 2000 02 705 | 4/2000 |
| DE | 198 54 396 | 6/2000 |
| DE | 10 2005 003 125 | 7/2006 |
| EP | 0 539 555 | 4/1996 |

(Continued)

OTHER PUBLICATIONS

Boedeker.com, "PTFE, FEP and PFA specifications", Feb. 3, 2007, accessed at http://web.archive.org/web/20070203072129/http://www.boedeker.com/feppfa_p.htm.*

*Primary Examiner* — Alison Hindenlang
(74) *Attorney, Agent, or Firm* — Kenyon & Kenyon LLP

(57) ABSTRACT

A sealing frame for delimiting a surface of a component which is to be covered with a molding compound includes an upper frame part and a lower frame part which may be detachably joined together. The component to be covered with the molding compound is enclosable by the upper frame part and the lower frame part in such a way that a cavity is formed by the sealing frame and the component. The component is inserted into the upper frame par and lower frame part, and the upper and lower frame part are joined to form the sealing frame, so that the cavity is formed which is enclosed by the component and the upper frame part, and a molding compound is introduced into the cavity and cured to form a cover.

5 Claims, 2 Drawing Sheets

(56) References Cited

FOREIGN PATENT DOCUMENTS

| JP | 56-29940 | 3/1981 |
| JP | 57-109343 | 7/1982 |
| JP | 58-215037 | 12/1983 |
| JP | 6-334095 | 12/1994 |
| JP | 9-186183 | 7/1997 |
| JP | 9-216254 | 8/1997 |
| JP | 2002-93833 | 3/2002 |
| JP | 2003-197658 | 7/2003 |
| JP | 3572772 | 10/2004 |

* cited by examiner

SEALING FRAME AND METHOD FOR COVERING A COMPONENT

BACKGROUND OF THE INVENTION

1. Field of the Invention

The present invention relates to a sealing frame and a method for delimiting a surface of a component which is to be covered with a molding compound.

2. Description of Related Art

To protect components from external environmental influences or influences of media, it is customary to cover the component with a molding compound. As the molding compound, it is usual here to employ epoxy low-pressure molding materials, which are applied to a surface of the component that is to be protected.

In particular in the case of electrical components, for example of electronic functional elements such as semiconductor elements and chips, increasingly higher demands are being made in regard to their temperature resistance, media resistance, performance improvement and reliability, in particular in safety-relevant applications. As a result of covering them with the molding compound, media from the environment are not able to come into contact with the components and cannot damage them.

To seal electronic components using punched grids without leaving burrs, at the present time encircling punched grid connections are used, but these must be punched out in a complicated process after the epoxy low-pressure molding material is applied. This may cause damage to the low-pressure molding compound cover.

Abrasion of the molding compounds on the tool edges is unable to prevent formation of burrs during the manufacturing process. This may result in contamination in subsequent process steps, however. To avoid formation of burrs, a frame that is firmly connected to the molding compound and encloses the component has been used. But this increases the construction space required for the component. In addition, a new frame must be manufactured for every component.

BRIEF SUMMARY OF THE INVENTION

A sealing frame designed according to the present invention for delimiting a surface of a component which is to be covered with a molding compound is made up of an upper frame part and a lower frame part, which may be detachably joined together. The component to be covered with the molding compound is enclosable by the upper frame part and the lower frame part in such a way that a cavity formed by the sealing frame and the component is sealed for the molding compound poured into the cavity.

Because of the design of the sealing frame having an upper frame part and a lower frame part, which may be detachably joined together, it is possible for the frame to be re-used for similar parts, in particular in mass production of components. Because it is possible to remove the frame again after the component has been covered with the molding compound, the frame does not increase the construction space that is needed for the component. In addition, use of the frame makes it possible to achieve a burr-free covering of the component.

To enable detachment of the sealing frame after the molding compound has been introduced, it is preferred to make the sealing frame out of a thermoplastic synthetic material that does not bond with the molding compound. Because of the use of a thermoplastic synthetic material that does not bond with the molding compound, it is not necessary to apply an additional parting agent to the sealing frame to prevent the molding compound from bonding with the sealing frame. This makes it possible to remove the sealing frame more easily.

To cure the molding compound, the component provided with the sealing frame is usually heated. The heating results in expansion of the thermoplastic synthetic material of the sealing frame. During cooling, both the sealing frame and the molding compound contract. This causes a gap to form between the molding compound and the thermoplastic synthetic material, which has not bonded with the molding compound. This likewise makes it easier to remove the sealing frame after the surface has been covered with the molding compound.

Examples of suitable thermoplastic synthetic materials from which the sealing frame may be made are perfluoroalkoxy copolymers. Which thermoplastic synthetic materials are suitable in a particular case is also dependent on the molding compound being used.

The use of a thermoplastic synthetic material for the sealing frame has the further advantage that the sealing frame may be manufactured in a simple manner using a spray molding process. It is also possible, for example when changing production or when there is a change in the shape of the component to be covered by the molding compound, to melt down the frame and make a new sealing frame from the molten material.

In one example embodiment, the sealing frame includes clips using which the upper frame part and the lower frame part may be joined together. It is possible in this case for example for the clips to be rotatably connected to the upper frame part or to the lower frame part and to be joined to a device connected to the other frame part. Alternatively, it is also possible to provide clip fasteners that are not firmly connected to one of the frame parts. Also suitable however, as an alternative to clip fasteners, is any other detachable connection for joining the upper frame part to the lower frame part. For example, screws or, with round components, a bayonet catch, may also be used. Any other type of detachable connection of the upper frame part to the lower frame part that is known to those skilled in the art may also be used. Clip fasteners are preferred, however, because of the simple and quick attachment.

If parts of the component are not to be covered by the molding compound, for example in the case of a component having a punched grid, areas of the punched grid which are used for example as electrical connections, it is preferred if gaps are formed between the upper and the lower frame parts of the sealing frame through which the parts of the component that are not to be covered by the molding compound may be passed. In this case, the gaps are preferably shaped so that the parts of the component that are passed through gaps fit closely in the gaps, so that the molding compound cannot escape through the gaps. For simple assembly of the sealing frame, it is preferred if the gaps are designed in the form of recesses in the upper frame part and/or in the lower frame part.

To obtain exact positioning of the frame in a casting mold, it is preferred if clip holders, using which the sealing frame is positioned in the casting mold, together with the component, are attached to the sealing frame. Also suitable besides clip holders, however, are any other devices using which exact positioning of the sealing frame together with the component enclosed by the sealing frame in the casting mold can be realized.

One method according to the present invention for covering a component with a molding compound using the sealing frame includes the following steps:

(a) placing the component in the upper frame part and lower frame part and joining the upper and lower frame parts to form the sealing frame, so that a cavity is formed which is surrounded by the component and the upper frame part, (b) introducing a molding compound into the cavity and curing the molding compound, (c) removing the frame by detaching the connection of the upper and lower frame parts and removing the component.

To place the component in the upper and lower frame parts, the component is usually placed on the lower frame part and the upper frame part is positioned on top. Then the lower and upper frame parts are joined together. In this way, the component forms a floor of the cavity and the upper frame part forms the surround of the cavity.

To position the component in the upper and lower frame parts, it is preferred if a groove is formed in both the lower frame part and the upper frame part, into which the component is inserted. If the component includes areas that are not to be covered by the molding compound, for example parts of a punched grid, it is generally sufficient to pass the areas that are not to be covered by the molding compound through corresponding recesses in the lower and/or upper frame part and to position the component in this way.

The molding compound is generally introduced into the cavity in a casting mold. To this end, the component is first placed in the casting mold. Exact positioning of the component with the sealing frame may be achieved for example using positioning aids, for example the previously mentioned clip holders. As soon as the component with the sealing frame is placed in the casting mold, the mold is heated. Alternatively, it is also possible for the component together with the sealing frame to be placed in an already warm casting mold. Because of the heating, the lower frame part and the upper frame part expand and thus press closely against the component. A tight connection between component and sealing frame is achieved. Thus the molding compound cannot escape through leakage channels between the upper or lower frame part and the component. This makes it possible to introduce the molding compound without burrs.

In particular, if the component includes parts that are not to be covered by the molding compound, for example parts of a punched grid that serve for example as electrical connections and which are passed through gaps in the sealing frame, the lower frame part and the upper frame part come to rest against the parts passed through the frame part as a result of the expansion due to the heating, so that a fluid-tight connection is produced here also.

The molding compound is introduced into the cavity by a customary method known to those skilled in the art. By preference, the molding compound is introduced into the cavity by a casting process, in particular a low-pressure casting process. For this purpose the molding compound is normally present as a liquid. After being introduced into the cavity, the molding compound is cured. The molding compound used may be for example radiation-curable or heat-curable. By preference, the molding compound is heat-curable.

An example of a suitable molding compound is a low-pressure molding compound, in particular an epoxy low-pressure molding compound.

The component that is covered with the molding compound by the method according to the present invention preferably includes a populated circuit board. Such a circuit board is normally populated with semiconductor elements. However, any other type of electronic components that are normally placed on a circuit board may also be included, for example resistors.

In another example embodiment the component also includes a punched grid.

If the component includes a punched grid, it is preferred that the punched grid be inserted into the lower frame part first. If parts of the punched grid are not to be covered by the molding compound, recesses are provided in the lower frame part, which are used as passages for the parts of the punched grid that are not to be covered. The punched grid is inserted at these outlets. In a next step the upper part of the frame is joined with the lower part of the frame. This is accomplished for example by clipping the upper part of the frame to the lower part of the frame. After the punched grid has been fastened in the sealing frame, in a next step a circuit board may be soldered to the punched grid and populated. Alternatively, it is also possible to connect an already populated circuit board to the punched grid.

If one punched grid is provided for a plurality of modules, then it is possible to already provide a plurality of modules with the sealing frame in the manner described above. In this case, after the sealing frame and the circuit board have been placed, individual modules including the sealing frame, the punched grid, and the circuit board are separated from a punched grid strip from which the punched grid for the individual modules is made. After the individual modules have been separated, the module is placed into the casting mold, into which the molding material is introduced.

After the molding material has cured, the module is removed from the casting mold. During cooling, the sealing frame and the casting material contract, as described earlier. This causes a gap to form between molding material and sealing frame. The frame may be removed in a simple manner by detaching the connection, and re-used for another module.

DETAILED DESCRIPTION OF THE INVENTION

Figure 1:
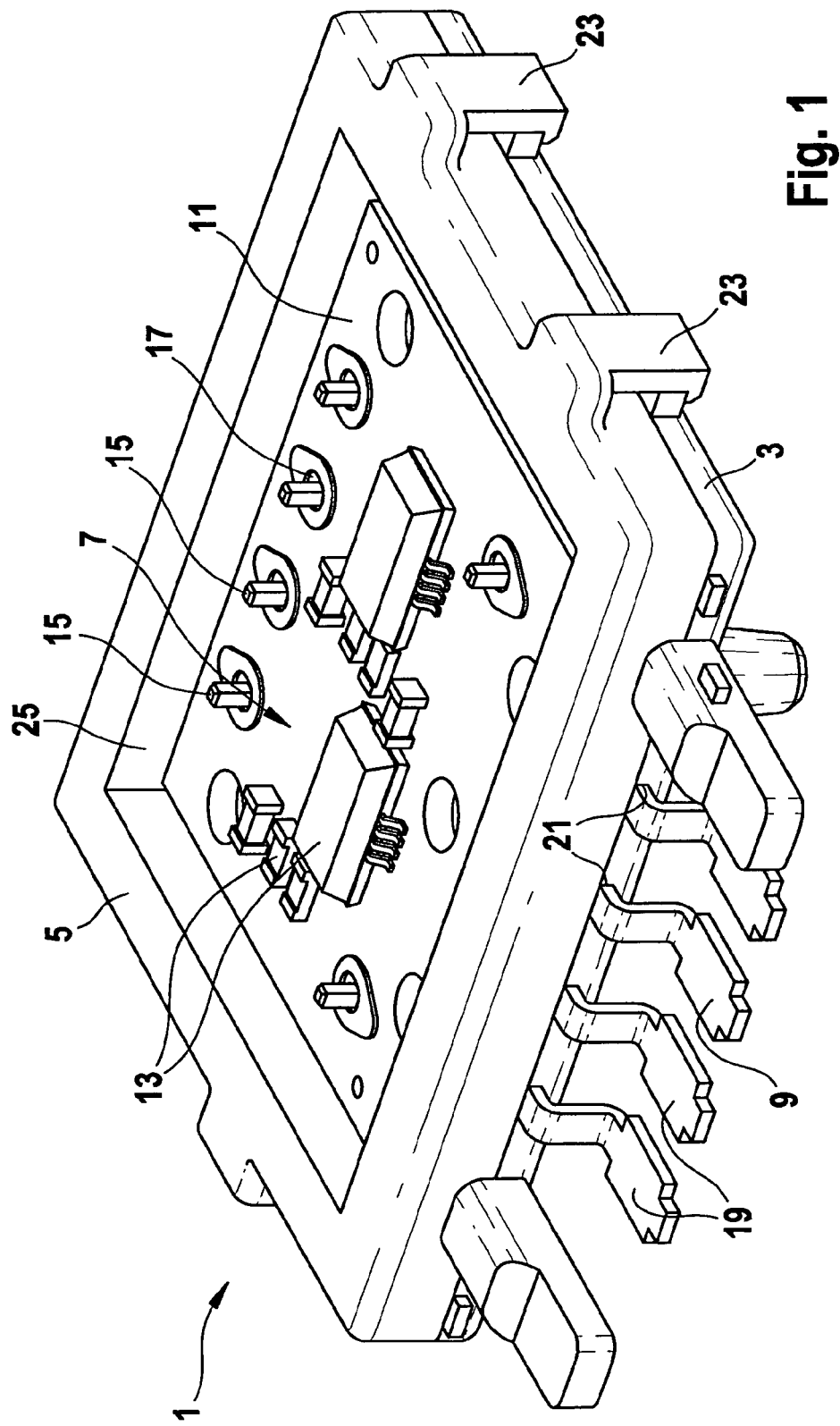
FIG. 1 shows a schematic depiction of a sealing frame with punched grid and circuit board.

FIG. 1 shows a schematic depiction of a sealing frame with punched grid and circuit board clipped in place.

A sealing frame 1 designed according to the present invention includes a lower frame part 3 and an upper frame part 5. Lower frame part 3 and upper frame part 5 are joined together to make sealing frame 1.

Lower frame part 3 and upper frame part 5 are preferably made of a thermoplastic synthetic material. Because a thermoplastic synthetic material is used, lower frame part 3 and upper frame part 5 may be manufactured in a simple manner using a spray molding process. The thermoplastic synthetic material of which lower frame part 3 and upper frame part 5 are made is preferably a plastic, since it does not bond with the material of the molding compound. Suitable thermoplastic synthetic materials are for example perfluoroalkoxy copolymers.

Sealing frame 1 surrounds a component 7. In the specific embodiment depicted here, component 7 is a circuit board 11 connected to a punched grid 9. Circuit board 11 is populated with electronic components 13. Electronic components are for example semiconductor elements such as chips or transistors. Electronic components 13 may also be for example resistors, or any other electronic components with which a circuit board 11 is normally populated.

Circuit board 11 is connected to punched grid 9 in any manner known to those skilled in the art. So it is possible, for example, that circuit board 11 is soldered to punched grid 9. Clamping of circuit board 11 to punched grid 9 is also possible. In addition, it is also possible for circuit board 11 to only be laid on punched grid 9. In order to position circuit board 11 exactly on punched grid 9, it is customary for example for the punched grid to include pins 15 which are passed through corresponding openings 17 in circuit board 11.

To position punched grid 9 and circuit board 11 in sealing frame 1, it is possible for example to first lay punched grid 9 in lower frame part 3. If punched grid 9 has connectors 19 that protrude from sealing frame 1, as depicted in FIG. 1, it is advantageous if recesses 21 are formed in lower frame part 3, through which connectors 19 are passed. Laying connectors 19 in recesses 21 also results in exact positioning of punched grid 9 in lower frame part 3. After punched grid 9 has been placed in lower frame part 3, lower frame part 3 is joined to upper frame part 5. The joining of upper frame part 5 with lower frame part 3 is done for example using clip fasteners 23, as depicted here. Alternatively, it is also possible however to join the lower frame part to the upper frame part for example by using screws or other detachable fastening means. In particular in the case of a round component, it is also possible for example to join lower frame part 3 with upper frame part 5 using a bayonet catch.

After lower frame part 3 has been joined to upper frame part 5, circuit board 11 is connected to punched grid 9 and is populated with electronic components 13. Along with electronic components 13, mechanical components may also be provided in addition, for example coolers, or the like.

Alternatively, it is also possible to first populate circuit board 11 with electronic components 13, and to connect it to punched grid 9 only after it has been populated. In another alternative specific embodiment it is also possible to first connect punched grid 9 and populated circuit board 11, and then to position punched grid 9 connected to circuit board 11 in sealing frame 1, assembled from lower frame part 3 and upper frame part 5.

If the component to be covered with the molding compound does not include a punched grid 9, then it is possible alternatively for example for a groove to be formed in lower frame part 3 and/or in upper frame part 5, into which the component is inserted. By being inserted into the groove, the component is positioned correctly in sealing frame 1.

Component 7, for example circuit board 11 connected to punched grid 9, may be covered both on the upper side and on the lower side. Normally at least the upper side of component 7 is covered with the molding compound. If a covering is provided on upper side and lower side, then it is possible for example to provide a gap between circuit board 11 and sealing frame 1, in particular if component 7 is positioned in sealing frame 1 by positioning punched grid 9. In this case, the molding compound may reach both sides of circuit board 11 through the gap. Alternatively, it is of course also possible to introduce the molding compound into the sealing frame both on the upper side of circuit board 11 and on the lower side of circuit board 11. If only the upper side of component 7 is to be covered, then sealing frame 1 is in close contact with component 7, and thus forms a cavity that is filled with the molding compound.

After component 7 has been secured in sealing frame 1, the molding compound is introduced, so that component 7 is covered by the molding compound. To this end, it is preferred that sealing frame 1 joined to component 7 be placed in a casting mold. The casting mold is preferably heated. Heating the casting mold causes lower frame part 3 and upper frame part 5 to expand and thus to press tightly against the walls of the casting mold. In addition, component 7 is tightly enclosed by sealing frame 1, so that no molding compound is able to escape through the sealing frame. In particular, no molding compound enters a gap between lower frame part 3 and upper frame part 5. After a short warm-up phase of no more than 5 minutes, preferably no more than 2 minutes, in particular no more than 1 minute, the molding compound is introduced into the casting mold. The temperature to which the casting mold is heated is preferably in the range from 160° to 180° C., in particular in the range from 160° to 170° C.

After component 7, which has been joined with sealing frame 1, has been placed into the casting mold and sealing frame 1 has been heated, the molding compound is sprayed into the mold in a conventional way known to those skilled in the art. The molding compound is preferably a low-pressure molding compound, in particular an epoxy low-pressure molding compound.

In so doing, the molding compound is introduced into a cavity 25 which is delimited by upper frame part 5 and component 7. Component 7 forms the floor of cavity 25, and upper frame part 5 forms the lateral boundary. If the molding compound is to be introduced on the upper side and the lower side of the component, then the lower side of component 7 and lower frame part 3 form a second cavity, which is also filled by the molding compound. It is also possible, as described earlier, that a gap is formed between component 7 and sealing frame 1. In that case, upper cavity 25 and the cavity delimited by component 7 and lower frame part 3 are connected to each other by the gap.

After the molding compound has been introduced, the molding compound is normally cured in the casting mold. To this end the casting mold is heated, in particular in the case of a heat-curable molding compound. In addition to heat-curable molding compounds, however, it is also possible for example to use radiation-curable molding compounds. In that case the molding compound is irradiated in order to cure it, for example using UV light. In this case as well, the molding compound normally warms up due to the curing reaction.

Figure 2:
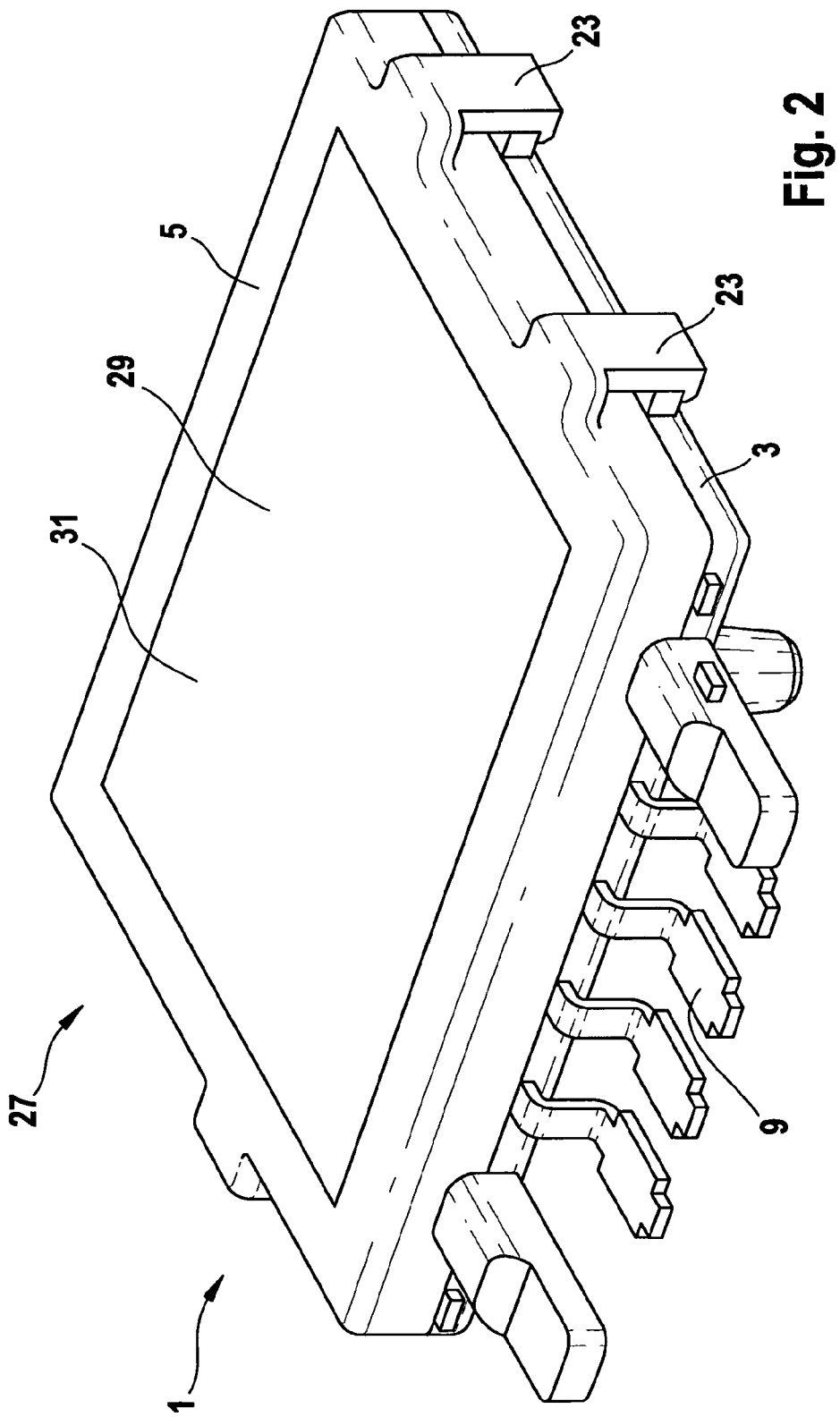
FIG. 2 shows schematic depiction of the sealing frame with punched grid according to FIG. 1, with molding compound introduced.

After the molding compound has cured, module 27 thus produced, which is depicted in FIG. 2, is removed from the spray molding form. Module 27 includes in this case sealing frame 1 made of joined lower frame part 3 and upper frame part 5, punched grid 9, component 7, and a covering 29 made of the cured molding compound. Covering 29 is in contact with sealing frame 1. The upper side of covering 29 may be smooth, or may have any structure. If upper side 31 of covering 29 has a structure, the structure is reproduced as a negative form in the casting mold.

After the molding compound has cured, module 27 cools down. The cooling of module 27 may take place either in the casting mold or after it has been removed from the casting mold. Sealing frame 1 and covering 29 shrink out of the molding compound due to the cooling. The degree of shrinkage here is a function of the coefficient of thermal expansion of the material used for sealing frame 1 and covering 29. Because of the loss of volume connected with the shrinkage, a small gap forms between covering 29 and sealing frame 1. The gap forms in particular because the molding compound for covering 29 does not adhere to the material of sealing frame 1. Because sealing frame 1 does not adhere to covering 29 made of the molding compound, it is possible to open sealing frame 1 in a simple manner by detaching the connection, for example clip fastener 23, and upper frame part 5 and lower frame part 3 may be removed from component 7 which has been provided with covering 29. After upper frame part 5 and lower frame part 3 have been removed, they may be further cooled if necessary, and then re-used to apply the covering to another component.

Examples of components that can be provided with a covering 29 using the sealing frame 1 according to the present invention include transmission position sensors and high-current modules.

What is claimed is:

1. A sealing frame for delimiting a surface of a component to be covered by a molding compound, comprising:
   an upper frame part; and
   a lower frame part;
   wherein the upper frame part and the lower frame part are configured to be detachably joined together and configured to enclose at least a main portion of the component to create a boundary around a perimeter of the component while exposing the main portion through a cavity in the upper frame part, to be subsequently covered by the molding compound in such a way that the cavity is defined by the upper frame part and wherein the component is sealed by the molding compound introduced into the cavity.

2. The sealing frame as recited in claim 1, wherein the sealing frame is formed of a thermoplastic synthetic material which does not bond with the molding compound.

3. The sealing frame as recited in claim 2, wherein the thermoplastic synthetic material is a perfluoroalkoxy copolymer.

4. The sealing frame as recited in claim 1, further comprising:
   at least one clip fastener configured to selectively join together the upper frame part and the lower frame part.

5. The sealing frame as recited in claim 4, wherein at least one gap is formed between the upper frame part and the lower frame part, and wherein at least one portion of the component not to be covered by the molding compound extends through the at least one gap.

* * * * *